United States Patent
Carlson et al.

(10) Patent No.: US 11,189,460 B1
(45) Date of Patent: Nov. 30, 2021

(54) SYSTEM, APPARATUS AND METHOD FOR VARIABLE LENGTH ELECTRODE IN LINEAR ACCELERATOR

(71) Applicant: Applied Materials, Inc., Santa Clara, CA (US)

(72) Inventors: Charles T. Carlson, Cedar Park, TX (US); Paul J. Murphy, Reading, MA (US); Frank Sinclair, Boston, MA (US); William Davis Lee, Rockport, ME (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/091,504

(22) Filed: Nov. 6, 2020

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/08* (2013.01)

(58) Field of Classification Search
CPC ... H01J 37/3171; H01J 37/304; H01J 2237/08
See application file for complete search history.

(56) References Cited

U.S. PATENT DOCUMENTS

| | | | | |
|---|---|---|---|---|
| 2,439,831 | A * | 4/1948 | Varian | H01J 25/12 315/5.47 |
| 2012/0061564 | A1 * | 3/2012 | Tona | H01J 37/256 250/307 |
| 2019/0371562 | A1 * | 12/2019 | Sinclair | H01J 37/04 |
| 2020/0357603 | A1 * | 11/2020 | Sinclair | H01J 37/3007 |

* cited by examiner

*Primary Examiner* — Sean M Luck
(74) *Attorney, Agent, or Firm* — Kacvinsky Daisak Bluni PLLC

(57) ABSTRACT

An apparatus may include an RF power assembly, arranged to output an RF signal, and a drift tube assembly, arranged to transmit an ion beam, and coupled to the RF power assembly. The drift tube assembly may include a first ground electrode; an AC drift tube assembly, disposed downstream of the first ground electrode; and a second ground electrode, disposed downstream of the AC drift tube assembly, where the AC drift tube assembly comprises at least one variable length AC drift tube.

20 Claims, 6 Drawing Sheets

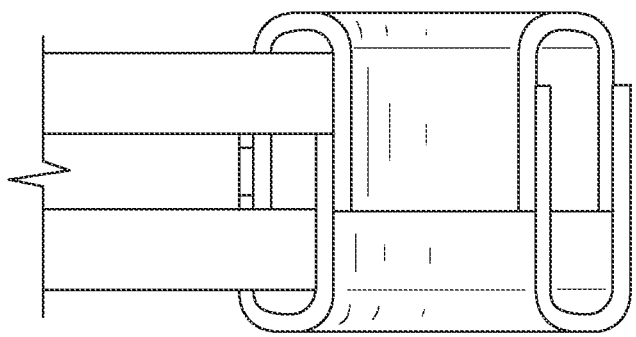
FIG. 5B
| ELEMENT A(AMU) | LENGTH OF π DRIFT @ 13.56MHZ (CM) | | |
|---|---|---|---|
| | B | P | As |
| | 11 | 31 | 75 |
| 0.08 | 4.4 | 2.6 | 1.7 |
| 0.2 | 6.9 | 4.1 | 2.6 |
| 0.5 | 11 | 6.5 | 4.2 |
| 1 | 15 | 9.2 | 5.9 |
| 2 | 22 | 13 | 8.4 |
| 3 | 27 | 16 | 10 |
| 4 | 31 | 18 | 12 |
| 5 | 35 | 21 | 13 |
| 6 | 38 | 23 | 14 |
| 10 | 49 | 29 | 19 |
| ELEMENT A(AMU) | LENGTH OF π DRIFT @ 40MHZ (CM) | | |
|---|---|---|---|
| | B | P | As |
| | 11 | 31 | 75 |
| 0.08 | 1.5 | 0.9 | 0.6 |
| 0.2 | 2.3 | 1.4 | 0.9 |
| 0.5 | 3.7 | 2.2 | 1.4 |
| 1 | 5.2 | 3.1 | 2.0 |
| 2 | 7.4 | 4.4 | 2.8 |
| 3 | 9.1 | 5.4 | 3.5 |
| 4 | 10 | 6.2 | 4.0 |
| 5 | 12 | 7.0 | 4.5 |
| 6 | 13 | 7.6 | 4.9 |
| 10 | 17 | 10 | 6.3 |
$L = V/(2F) = SQRT(2E/M)/(2F)$
FIG. 5C
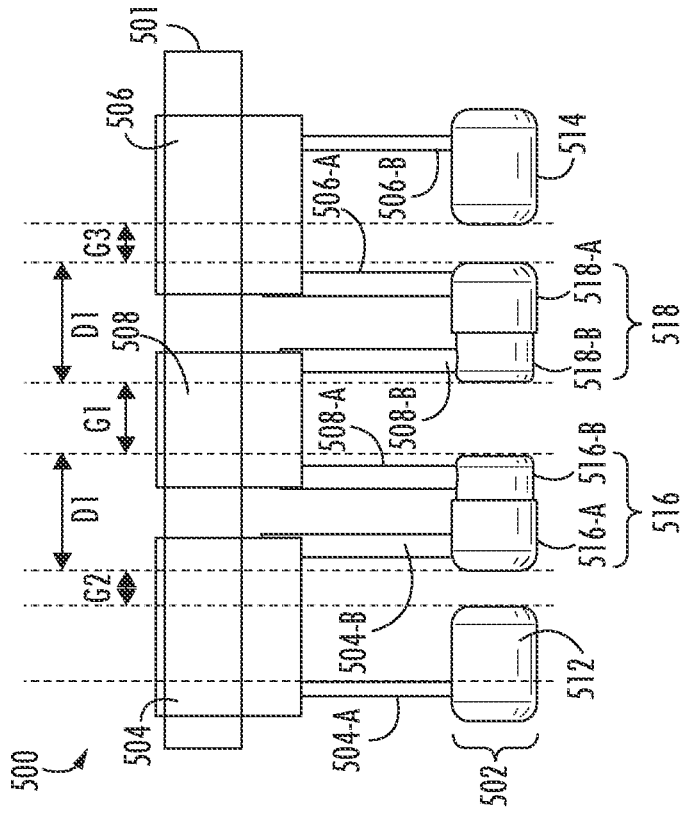
FIG. 5A

SYSTEM, APPARATUS AND METHOD FOR VARIABLE LENGTH ELECTRODE IN LINEAR ACCELERATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an AC voltage signal. Known (RF) LINACs are driven by an RF voltage applied at 13.56 MHz-120 MHz.

One issue for operation of RF LINAC ion implanters is that the acceleration stages are arranged for accelerating ions having a specific mass/charge ratio (m/q) so that a maximum amount of ions can be conducted through the acceleration stages. In particular, in order to maximally accelerate an ion through a given acceleration stage, the length of a given AC drift tube may be optimized according to the velocity of the ion entering the AC drift tube. Besides the factor of the ion energy entering the drift tube, this length will be determined by the m/q ratio. Accordingly, an RF LINAC that has AC drift tubes that are sized to optimally accelerate a relatively lower mass species, will not optimally accelerate a relatively higher mass species. With respect to these and other considerations the present disclosure is provided.

BRIEF SUMMARY

In one embodiment an apparatus is provided with an RF power assembly, arranged to output an RF signal, and a drift tube assembly, arranged to transmit an ion beam, and coupled to the RF power assembly. The drift tube assembly may include a first ground electrode; an AC drift tube assembly, disposed downstream of the first ground electrode; and a second ground electrode, disposed downstream of the AC drift tube assembly, where the AC drift tube assembly comprises at least one variable length AC drift tube.

In another embodiment, an ion implanter may include an ion source to generate an ion beam, a buncher to output the ion beam as a bunched ion beam, and a linear accelerator, to transport and accelerate the bunched ion beam, the linear accelerator comprising a plurality of acceleration stages. As such, a given acceleration stage of the plurality of acceleration stages may include an RF power assembly, arranged to output an RF signal, and a drift tube assembly, arranged to transmit an ion beam, and coupled to the RF power assembly. The drift tube assembly may include a first ground electrode, an AC drift tube assembly, disposed downstream of the first ground electrode, and a second ground electrode, disposed downstream of the AC drift tube assembly, wherein the AC drift tube assembly comprises at least one variable length AC drift tube.

In a further embodiment, a method of operating a linear accelerator may include generating a first pulsed ion beam, the first pulsed ion beam comprising a first m/q ratio, and conducting the first pulsed ion beam through a variable length AC drift tube assembly, arranged in a first configuration, having a first drift tube couple length. The method may include generating a second pulsed ion beam, comprising a second m/q ratio, different from the first m/q ratio, and conducting the second pulsed ion beam through the variable length AC drift tube assembly, arranged in a second configuration, having a first second drift tube couple length, different than the first drift tube couple length.

BRIEF DESCRIPTION OF THE DRAWINGS

FIG. 5A shows anther exemplary apparatus, according to embodiments of the disclosure;

FIG. 5B shows drift tube details of a variant of the apparatus of FIG. 5A;

FIG. 5C presents a tabulation of ideal drift tube lengths for three different ion species (amu) and two different RF voltage frequencies, shown as a function of ion energy.

Figure 1A:
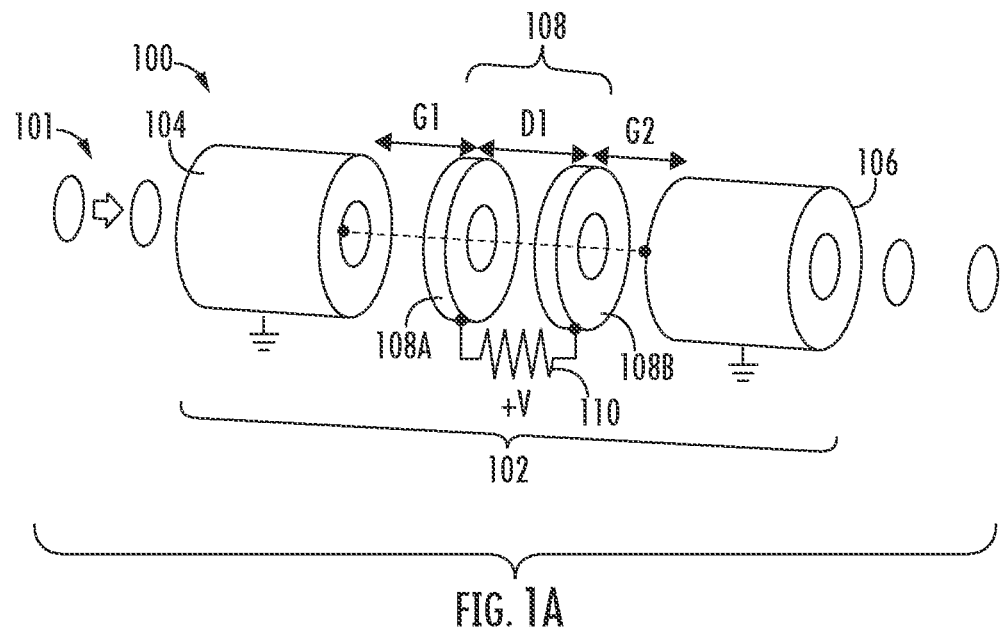
FIG. 1A shows an exemplary apparatus, in a first configuration, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that provide the capability of flexibly adjusting the effective drift length within acceleration stages of a linear accelerator.

FIG. 1A shows an exemplary apparatus, in a first configuration, according to embodiments of the disclosure. The apparatus 100 represents a drift tube assembly 102 and associated components for accelerating an ion beam in an acceleration stage of a linear accelerator. In particular, the apparatus 100 defines a double gap acceleration stage arrangement, where an ion beam is conducted through two accelerating gaps within the apparatus 100. The apparatus 100 may include an RF power assembly 110 that drives various components of the drift tube assembly 102 with an RF signal. The RF power assembly 110 is shown schematically without details, and may include a power source, resonator, network, and other known components. The drift tube assembly 102 is arranged as a series of hollow tubes to conduct an ion beam therethrough. The ion beam is accelerated when crossing the gap G1 and the gap G2.

As shown in FIG. 1A, the drift tube assembly 102 may include a first ground electrode 104, an AC drift tube assembly 108, disposed downstream of the first ground electrode 104; and a second ground electrode 106, disposed downstream of the AC drift tube assembly 108. As detailed in the discussion to follow, the AC drift tube assembly comprises a variable length AC drift tube couple, formed from a first part 108A and a second part 108B. As such, in this embodiment and other to follow, such a configuration may be referred to as an AC drift tube couple, where the configuration is formed of two separate parts that are biased with the same RF signal at the same phase. Said differently, these parts are electrically coupled to the Rf power assembly 110 to receive the same phase of an RF signal at the same time, so the electrostatic potential at the first part 108A and the second part 108B is the same at all times. Accordingly, no electrostatic potential and no electric field exists between the first part 108A and the second part 108B.

Figure 1B:
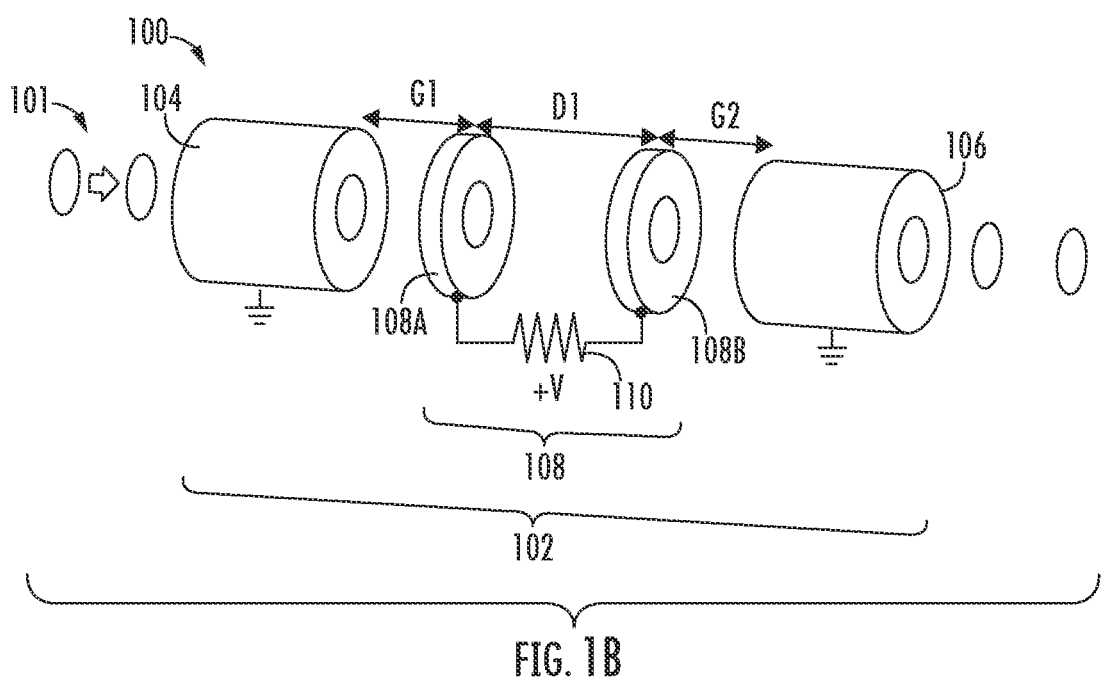
FIG. 1B shows the exemplary apparatus of FIG. 1A, in a second configuration, according to embodiments of the disclosure.

In accordance with various embodiments, the first part 108A and the second part 108B are movable with respect to one another along the direction of propagation of the ion beam, meaning along the drift tube axis (shown in the dashed line). Thus, the first part 108A and second part 108B may be deemed to form a variable length AC drift tube couple, in that the value of the length D1 may vary. FIG. 1B shows the AC drift tube assembly 108 in a second configuration, where the value of D1 has increased with respect to the configuration of FIG. 1A.

Varying the length of an AC drift tube couple will change the distance that a packet of ions spends within a region that is field free. Accordingly, such an AC drift tube couple, although formed of two separate parts, forms a virtual AC drift tube, having a variable length. Because ions having different m/q ratios may enter upstream side of the AC drift tube assembly 108 having different velocities for a given ion energy, the ability to vary the length of the AC drift tube assembly allows the length D1 to be tailored in a manner so that the phase of the RF signal seen by an ion beam 101 upon exit of the AC drift tube assembly 108 is optimized for optimal acceleration of the ion beam 101. Said differently, for a given RF frequency, the phase of the RF signal at the exit of the AC drift tube assembly 108 (downstream side) may be kept relatively constant, independent of m/q ratio by varying the length of the AC drift tube assembly 108 to maintain the time of flight of the ion packet at a relatively constant value. This circumstance is illustrated in FIG. 1A where the ion beam 101 enters the drift tube assembly 102 as a bunched ion beam in a series of packets, at a given velocity. The ion beam 101 may have a first mass, while an ion beam 103 in the scenario of FIG. 1B has a second mass, such that the ion beam 103 has a higher velocity. Accordingly, the AC drift tube couple (meaning AC drift tube assembly 108) may be lengthened to account for the higher velocity of the ion beam 103 so that the individual ion packets of the ion beam 103 exit the AC drift tube assembly 108 at the proper time to achieve optimum acceleration, according to the applied RF signal.

In the particular example of FIG. 1A, the AC drift tube assembly 108 comprises a solo AC drift tube couple, where the first gap, gap G1 lies between the first ground electrode 104 and the AC drift tube assembly 108, and where the second gap, gap G2, lies between the AC drift tube assembly 108, and the second ground electrode 106.

In different variants of the embodiment of FIG. 1A and FIG. 1B, the drift tube assembly 102 may be arranged so as to fix the gap G1 and the gap G2 at constant values. In other words, the first ground electrode 104 and the first part 108A may be movable in concert with one another with respect to the second part 108B, such that the gap G1 does not change when D1 is changed. Likewise, the second ground electrode 106 and the second part 108B may be movable in concert with one another with respect to the first part 108A, such that the gap G2 does not change when D1 is changed. In some embodiments, just gap G1 may remain fixed, while in other embodiments just gap G2 may remain fixed, depending upon the ion processing flexibility needed, as well as design complexity concerns.

Figure 2A:
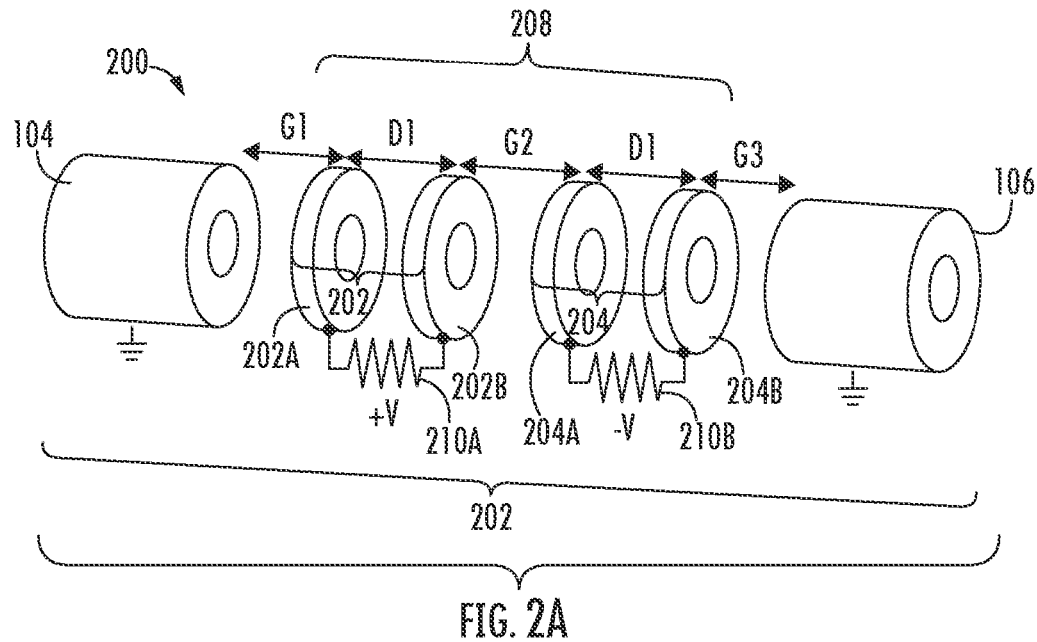
FIG. 2A shows another exemplary apparatus, in a first configuration, according to embodiments of the disclosure.

In other embodiments of the disclosure, an AC drift tube assembly may be formed with a first AC drift tube couple, and a second AC drift tube couple. Such an arrangement is shown in FIG. 2A. The apparatus 200 defines a triple gap configuration, comprising a first gap, shown as gap G1, between the first ground electrode 104 and first AC drift tube couple 202, a second gap, shown as gap G2, between first AC drift tube couple 202 and the second AC drift tube couple 204, and a third gap, shown as gap G3, between the second AC drift tube couple 204 and the second ground electrode 106.

In known triple gap accelerator configurations, two different AC drift tubes may be coupled to opposite ends of a resonator that supplies a RF voltage signal at a given frequency. As such, the first voltage signal delivered to the first AC drift tube may be 180 degrees out of phase with a second voltage signal that is simultaneously delivered to the second AC drift tube. The apparatus 200 of FIG. 2A and FIG. 2B may operate under similar principles, where the component 210A delivers a voltage signal (shown as +V) that is 180 degrees out of phase with the voltage signal (shown as −V) delivered by the second component 210B to the second AC drift tube couple 204. For example, the first AC drift tube couple 202 may be coupled to one end of a resonator, while the second AC drift tube couple 204 is coupled to an opposite end of a resonator in a manner in a manner that delivers an RF voltage signal that is received 180 degrees out of phase between the two AC drift tube couples.

Figure 2B:
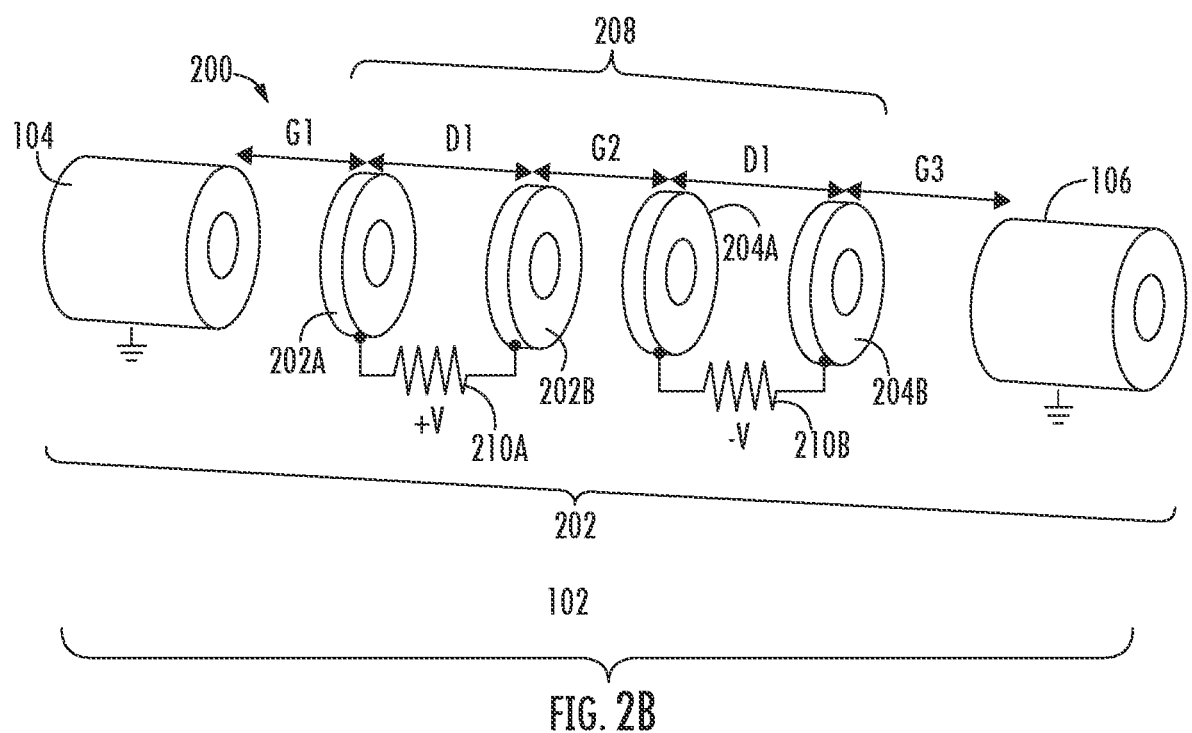
FIG. 2B shows the exemplary apparatus of FIG. 2A, in a second configuration, according to embodiments of the disclosure.

In accordance with various embodiments, the first part 202A and the second part 202B of the first AC drift tube couple 202 are movable with respect to one another along the direction of propagation of the ion beam, meaning along the drift tube axis (shown in the dashed line). Thus, the first part 202A and second part 202B may be deemed to form a variable length AC drift tube couple, in that the value of the length D1 may vary. FIG. 2B shows the AC drift tube assembly 208 in a second configuration, where the value of D1 has increased.

Instead of or in addition to the movability of first part 202A and second part 202B with respect to one another, in accordance with various further embodiments, the first part 204A and the second part 204B of the second AC drift tube couple 204 are movable with respect to one another along the drift tube axis. FIG. 2B also shows the AC drift tube assembly 208 in a second configuration, where the value of D2 has also increased.

In different variants of the embodiment of FIG. 2A and FIG. 2B, the drift tube assembly 208 may be arranged so as to fix the gap G1, the gap G2, the gap G3, or any combination of these gaps at constant values. In other words, the first ground electrode 104 and the first part 202A may be movable in concert with one another with respect to any other components of the drift tube assembly 208, such that the gap G1 does not change when D1, D2 or both D1 and D2 are changed. Likewise, the second ground electrode 106 and the second part 204B may be movable in concert with one another with respect to the first part 108A, such that the gap G3 does not change when D2 is changed. In some embodiments, the second part 202B and first part 204a may be mechanically coupled to one another in a manner that gap G2 does not vary when D1 and/or D2 are changed. In some embodiments, just gap G1 may remain fixed, while in other embodiments just gap G2 may remain fixed, or just gap G3 may remain fixed, or just gap G1 and gap G2 may remain fixed, or just gap G1 and gap G3 may remain fixed, or just gap G2 and gap G3 may remain fixed, depending upon the ion processing flexibility needed, as well as design complexity concerns.

Figure 3:
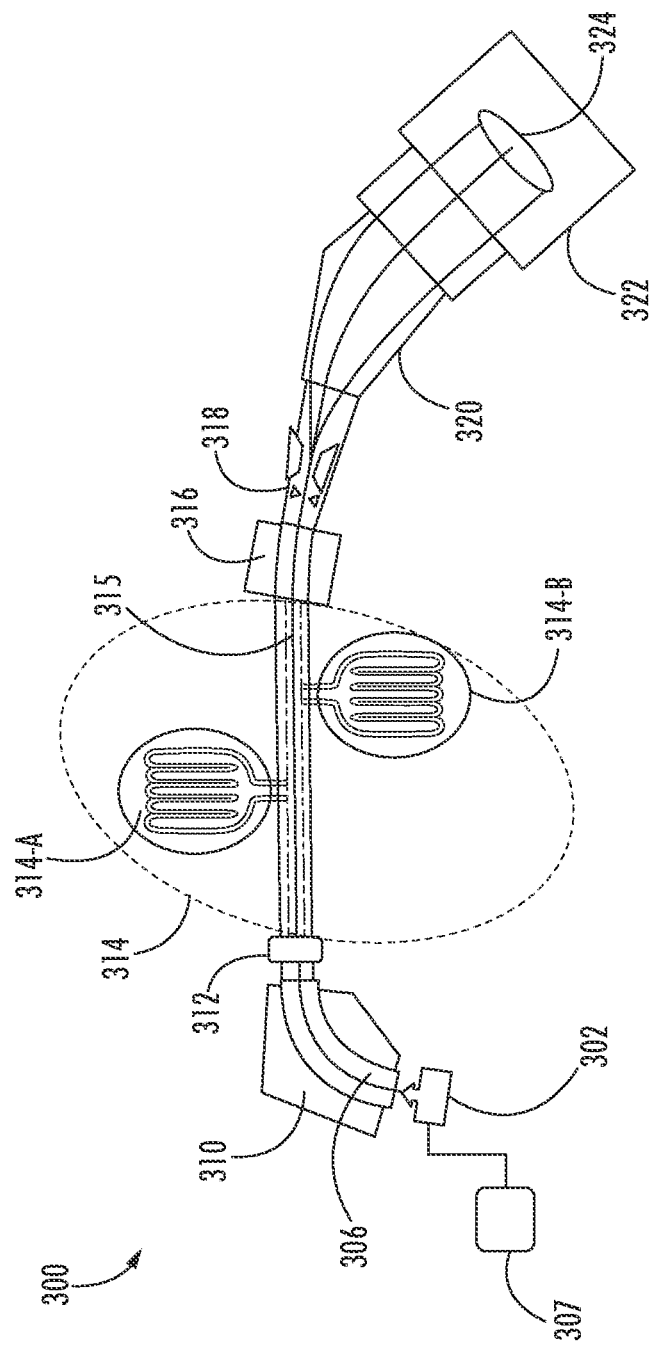
FIG. 3 shows an exemplary ion implantation system, according to embodiments of the disclosure.

FIG. 3 depicts a schematic of an apparatus, according to embodiments of the disclosure. The ion implanter 300 includes acceleration stages 314-A, 314-B of a LINAC, shown as linear accelerator 314. The ion implanter 300, may represent a beamline ion implanter, with some elements not shown for clarity of explanation. The ion implanter 300 may include an ion source 302, and a gas box 307 as known in the art. The ion source 302 may include an extraction system including extraction components and filters (not shown) to generate an ion beam 306 at a first energy. Examples of suitable ion energy for the first ion energy range from 5 keV to 100 keV, while the embodiments are not limited in this context. To form a high energy ion beam, the ion implanter 300 includes various additional components for accelerating the ion beam 306.

The ion implanter 300 may include an analyzer 310, functioning to analyze the ion beam 306 as in known apparatus, by changing the trajectory of the ion beam 306, as shown. The ion implanter 300 may also include a buncher 312, and a linear accelerator 314 (shown in the dashed line), disposed downstream of the buncher 312, where the linear accelerator 314 is arranged to accelerate the ion beam 306 to form a high energy ion beam 315, greater than the ion energy of the ion beam 306, before entering the linear accelerator 314. The buncher 312 may receive the ion beam 306 as a continuous ion beam and output the ion beam 306 as a bunched ion beam to the linear accelerator 314. The linear accelerator 314 may include a plurality of acceleration stages (314-A to 314-N (not shown)), arranged in series, as shown. In various embodiments, the ion energy of the high energy ion beam 315 may represent the final ion energy for the ion beam 306, or approximately the final ion energy. In various embodiments, the ion implanter 300 may include additional components, such as filter magnet 316, a scanner 318, collimator 320, where the general functions of the scanner 318 and collimator 320 are well known and will not be described herein in further detail. As such, a high energy ion beam, represented by the high energy ion beam 315, may be delivered to an end station 322 for processing a substrate 324. Non-limiting energy ranges for the high energy ion beam 315 include 500 keV-10 MeV, where the ion energy of the ion beam 306 is increased in steps through the various acceleration stages of the linear accelerator 314. In accordance with various embodiments of the disclosure, one or more of the acceleration stages of the linear accelerator 314 may include a drift tube assembly having at least one variable length AC drift tube couple, as detailed with respect to the embodiments of FIGS. 1A-2B. An advantage provided by the ion implanter 300 is that the length of an AC drift tube couple within the linear accelerator 314 may be adjusted according to different ion species having different m/q ratios and therefore different velocities when transported through the acceleration stages of the linear accelerator 314.

Figure 4:
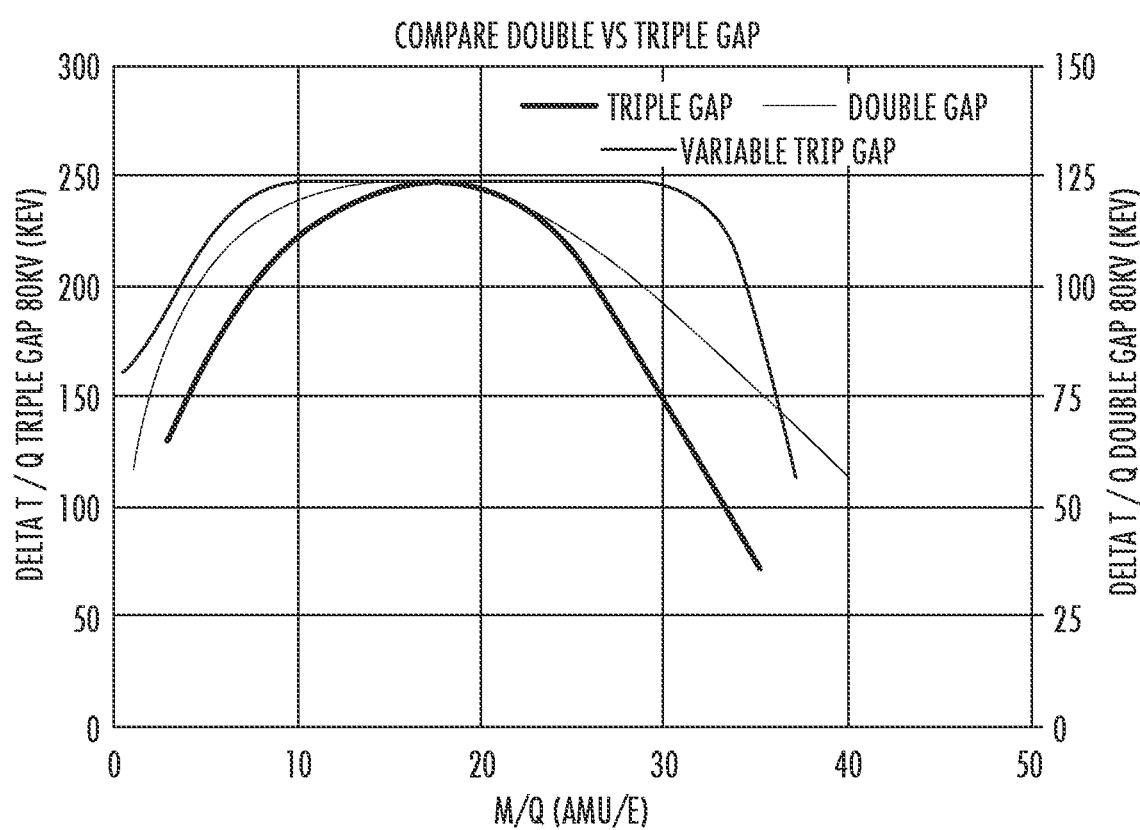
FIG. 4 illustrates the electrical characteristics as a function of position of the for different drift tube assemblies.

FIG. 4 illustrates the simulated electrical characteristics as a function of position of the for different drift tube assemblies. In FIG. 4 a parameter delta t/q is plotted as a function of m/q, where delta t/q represents the increase in ion energy generated by a given AC drift tube assembly within a given acceleration stage. The simulated increase in energy is based upon application of an RF signal having an 80 kV amplitude. The inner curve (thicker line) represents the behavior for a fixed triple gap drift tube assembly, while the intermediate curve represents the characteristics for a fixed double gap drift tube assembly. The fixed triple gap drift tube assembly generates a peak that is relatively constant between values of 15 to 20 m/q, representing an acceleration of 250 keV. The fixed double gap configuration generates a peak that is relatively constant over a broader range, between values of 12 to 17 m/q, while the drop-off in value is less at higher or lower values. However, the peak acceleration is just 125 keV. A variable length triple gap drift tube configuration according to the present embodiments is represented by the outer curve, where the length may be varied. In this latter configuration, the value of delta t/q reaches a peak value of 250 keV and remains constant between 9 and 29 amu/q, showing a wide range of mass that can be maximally accelerated.

FIG. 5A shows anther exemplary apparatus, according to embodiments of the disclosure. The apparatus 500 is arranged with a drift tube assembly 502 that has a triple gap drift tube configuration, shows as gap G1, gap G2, and gap G3, as generally described above with respect to FIG. 2A and FIG. 2B. FIG. 5B shows drift tube details of a variant of the apparatus of FIG. 5A. The apparatus 500 includes a support structure 504, a support structure 506, and a support structure 508, where these support structures may be disposed along a common support 501. The support structure 504 includes a first arm 504-A and a second arm 504-B. The first arm 504-A is mechanically coupled to a first ground drift tube 512, while the second arm 504-B is mechanically coupled to a first part 516-A of a first AC drift tube couple 516. In this manner, the first ground drift tube 512 is mechanically rigidly coupled to the first part 516-A.

The support structure 506 includes a first arm 506-A and a second arm 506-B. The first arm 506-A is mechanically coupled to a second part 518-B of a second AC drift tube couple 518, while the second arm 506-B is mechanically coupled to a second ground drift tube 514. In this manner, the second ground drift tube 514 is mechanically rigidly coupled to the second part 518-B.

The support structure 506 includes a first arm 506-A and a second arm 506-B. The first arm 506-A is mechanically coupled to a first part 518-A of a second AC drift tube couple 518, while the second arm 506-B is mechanically coupled to a second ground drift tube 514. In this manner, the second ground drift tube 514 is mechanically rigidly coupled to the first part 518-A.

The support structure 508 includes a first arm 508-A and a second arm 508-B. The first arm 508-A is mechanically coupled to a second part 516-B of the first AC drift tube couple 516, while the second arm 508-B is mechanically coupled to a second part 518-B of the second AC drift tube couple 518. In this manner, the second part 516-B of the first AC drift tube couple 516 is mechanically coupled to a second part 518-B of the second AC drift tube couple 518.

In accordance with embodiments of the disclosure, the support structure 504 and/or the support structure 506 may be slidably movable (along the direction of the arrows) with respect to the support structure 508. Accordingly, moving the support structure 504 with respect to support structure 508 will adjust the value of the length of the first AC drift tube couple 516, shown as D1. Likewise, moving the support structure 506 with respect to support structure 508 will adjust the value of the length of the second AC drift tube couple 518, shown as D2. At the same time the aforementioned mechanical coupling of the different parts of the drift tube assembly to support structures, ensures that the values of gap G1, gap G2, and gap G3 will not change when either or both of the support structure 504 and support structure 506 are moved with respect to the support structure 508.

To illustrate the advantage of creating a variable length effective drift tube, FIG. 5C provides a listing of ideal tube length for different ion species, hydrogen, boron, and phosphorous, shown as a function of ion energy up to 10 MeV. This length is the distance the specified ion travels in a time corresponding to 180° or π radians of the AC voltage. The tube length is also a function of signal frequency, and is shown for 13.56 MHz, commonly used in linear accelerators, as well as for a frequency of 40 MHz. Notably, for every ion energy, and at both frequencies shown, switching from phosphorous ions to boron ions corresponds to an increase in ideal drift tube length of more than a factor of 2. Additionally, as ion energy increases within a given species, the ideal drift tube length increases. For example, for accelerating boron ions using a 40 MHz RF resonator, increasing ion energy from 500 keV to 2 MeV increases the ideal drift tube length from 3.7 cm to 7.4 cm.

In view of the above considerations, the variable length drift tube assemblies as disclosed herein provide a useful approach to process a variety of ions at an ideal drift tube length.

Figure 6:
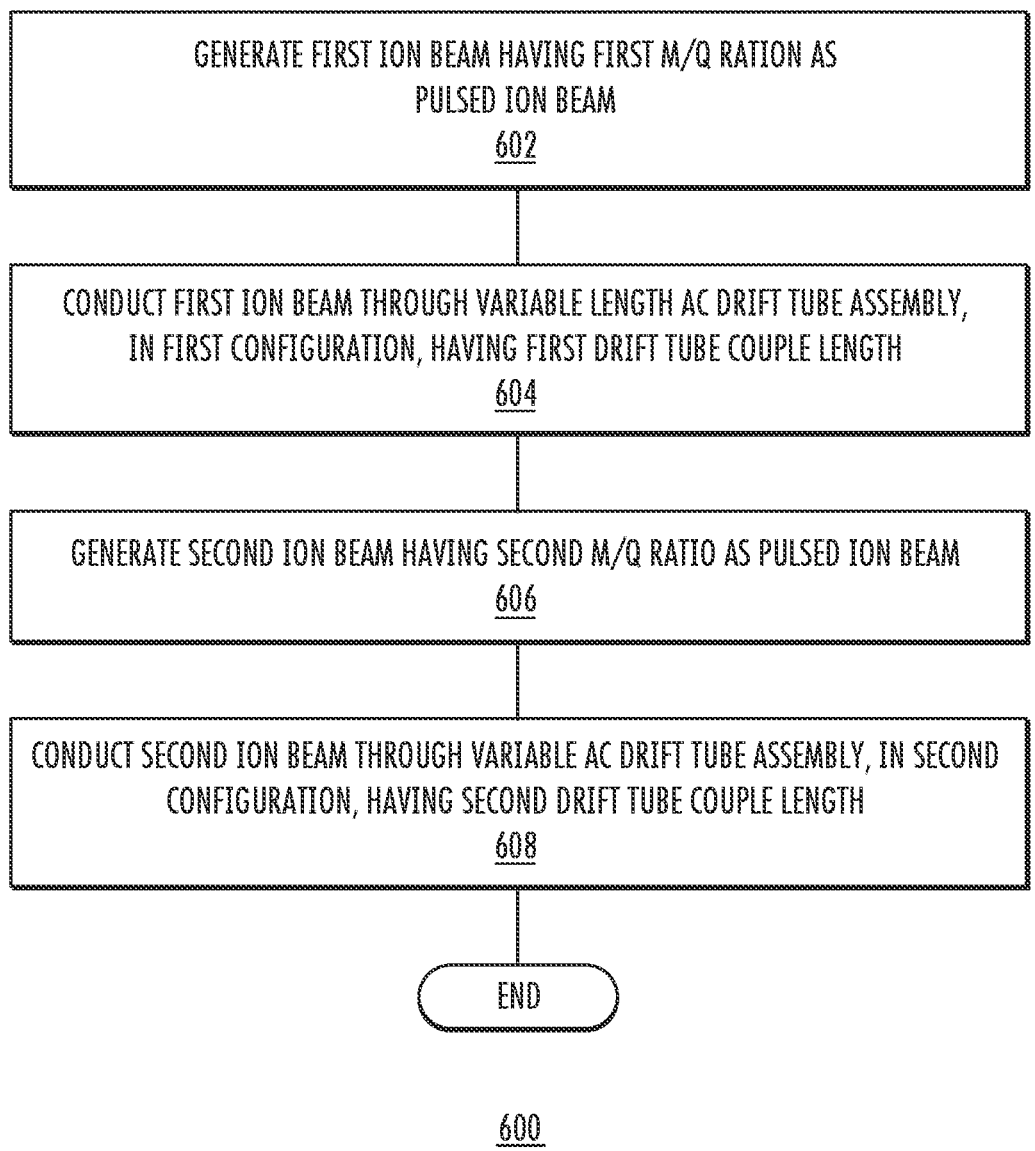
FIG. 6 presents an exemplary process flow.

FIG. 6 depicts an exemplary process flow 600. At block 602 a first ion beam is generated having a first m/q ratio as a pulsed ion beam. The pulsed ion beam may be generated by a buncher disposed at the beginning of a linear accelerator, to receive a continuous ion beam and output a bunched ion beam in a series of packets or pulses.

At block 604, the first ion beam is conducted through a variable length AC drift tube assembly, when arranged a in first configuration, having first drift tube couple length. The variable length drift tube assembly may be a double gap configuration where one variable length drift tube couple is present, or a triple gap configuration, where one or two variable length drift tube couples are present.

At block 606 a second ion beam is generated having a second m/q ratio as a pulsed ion beam. The pulsed ion beam may be generated by a buncher disposed at the beginning of a linear accelerator, to receive a continuous ion beam and output a bunched ion beam in a series of packets or pulses.

At block 608, the second ion beam is conducted through the variable length AC drift tube assembly, in a second configuration, having second drift tube couple length. The variable length drift tube assembly may be a double gap configuration where one variable length drift tube couple is present, or a triple gap configuration, where one or two variable length drift tube couples are present. In the case of a double gap configuration, the one variable length drift tube couple will be adjusted to define the second drift tube couple length. Likewise, in the case of a triple gap configuration, one variable length drift tube couple will be adjusted to define the second drift tube couple length. In addition, a second variable length drift tube couple may or may not be adjusted to define a fourth length, different than a third length in the block 604.

In view of the above, the present disclosure provides at least the following advantages. As a first advantage, the variable length drift tube assembly of the present embodiments provides the ability to set the optimal drift tube length matching a specific m/q for any given ion. A second advantage is that an ion implanter having a variable length drift tube assembly need not be dedicated to just one ion species having a specific m/q ratio, and may accordingly reduce hardware costs and provide increased flexibility for implantation.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
   an RF power assembly, arranged to output an RF signal; and
   a drift tube assembly, arranged to transmit an ion beam, and coupled to the RF power assembly, the drift tube assembly comprising:
   a first ground electrode;
   an AC drift tube assembly, disposed downstream of the first ground electrode; and a second ground electrode, disposed downstream of the AC drift tube assembly,
wherein the AC drift tube assembly comprises at least one variable length AC drift tube.

2. The apparatus of claim 1, wherein the AC drift tube assembly comprises a solo AC drift tube couple, and defines a double gap configuration, comprising a first gap, between the first ground electrode and AC drift tube assembly, and a second gap, between the AC drift tube assembly, and the second ground electrode.

3. The apparatus of claim 2, wherein the solo AC drift tube couple comprises a first part and a second part, slidably movable with respect to the first part along a drift tube axis.

4. The apparatus of claim 3, wherein the solo AC drift tube couple and the first ground electrode are movable in concert with one another, wherein a first value of the first gap, and a second value of the second gap do not change when the first part is slidably moved with respect to the second part along the drift tube axis.

5. The apparatus of claim 1, wherein the AC drift tube assembly comprises a first AC drift tube couple, and a second AC drift tube couple, and defines a triple gap configuration, comprising a first gap, between the first ground electrode and first AC drift tube couple, a second gap, between first AC drift tube couple and the second AC drift tube couple, and a third gap, between the second AC drift tube couple and the second ground electrode.

6. The apparatus of claim 5, wherein the first AC drift tube couple comprises a first part and a second part, slidably movable with respect to the first part along a drift tube axis.

7. The apparatus of claim 6, wherein the first part of the first AC drift tube couple and the first ground electrode are movable in concert with one another, wherein a first value of the first gap does not change when the first part is slidably moved with respect to the second part along the drift tube axis.

8. The apparatus of claim 7, wherein the second AC drift tube couple comprises a third part and a fourth part, slidably movable with respect to the third part along the drift tube axis, wherein a third value of the third gap does not change when the third part is slidably moved with respect to the fourth part along the drift tube axis.

9. The apparatus of claim 8, wherein the second gap does not change when the first part is slidably moved with respect to the second part of the first AC drift tube couple, or when the third part is slidably moved with respect to the fourth part of the second AC drift tube couple.

10. An ion implanter, comprising:
an ion source to generate an ion beam;
a buncher to output the ion beam as a bunched ion beam; and
a linear accelerator, to transport and accelerate the bunched ion beam, the linear accelerator comprising a plurality of acceleration stages, wherein a given acceleration stage of the plurality of acceleration stages comprises:
an RF power assembly, arranged to output an RF signal; and
a drift tube assembly, arranged to transmit an ion beam, and coupled to the RF power assembly, the drift tube assembly comprising:
a first ground electrode;
an AC drift tube assembly, disposed downstream of the first ground electrode; and
a second ground electrode, disposed downstream of the AC drift tube assembly,
wherein the AC drift tube assembly comprises at least one variable length AC drift tube.

11. The ion implanter of claim 10, wherein the AC drift tube assembly comprises a solo AC drift tube couple, and defines a double gap configuration, comprising a first gap, between the first ground electrode and AC drift tube assembly, and a second gap, between the AC drift tube assembly, and the second ground electrode.

12. The ion implanter of claim 11, wherein the solo AC drift tube couple comprises a first part and a second part, slidably movable with respect to the first part along a drift tube axis.

13. The ion implanter of claim 12, wherein the solo AC drift tube couple and the first ground electrode are movable in concert with one another, wherein a first value of the first gap, and a second value of the second gap do not change when the first part is slidably moved with respect to the second part along the drift tube axis.

14. The ion implanter of claim 10, wherein the AC drift tube assembly comprises a first AC drift tube couple, and a second AC drift tube couple, and defines a triple gap configuration, comprising a first gap, between the first ground electrode and first AC drift tube couple, a second gap, between first AC drift tube couple and the second AC drift tube couple, and a third gap, between the second AC drift tube couple and the second ground electrode.

15. The ion implanter of claim 14, wherein the first AC drift tube couple comprises a first part and a second part, slidably movable with respect to the first part along a drift tube axis.

16. The ion implanter of claim 15, wherein the first part of the AC drift tube couple and the first ground electrode are movable in concert with one another, wherein a first value of the first gap, does not change when the first part is slidably moved with respect to the second part along the drift tube axis.

17. The ion implanter of claim 16, wherein the first AC drift tube couple and the first ground electrode are movable in concert with one another, wherein a first value of the first gap does not change when the first part is slidably moved with respect to the second part along the drift tube axis.

18. A method of operating a linear accelerator, comprising:
generating a first pulsed ion beam, the first pulsed ion beam comprising a first m/q ratio;
conducting the first pulsed ion beam through a variable length AC drift tube assembly, arranged in a first configuration, having a first drift tube couple length;
generating a second pulsed ion beam, the second pulsed ion beam comprising a second m/q ratio, different from the first m/q ratio; and
conducting the second pulsed ion beam through the variable length AC drift tube assembly, arranged in a second configuration, having a second drift tube couple length, different than the first drift tube couple length.

19. The method of claim 18, wherein the variable length AC drift tube assembly comprises just one variable length AC drift tube couple, defining a double gap configuration.

20. The method of claim 18, wherein the variable length AC drift tube assembly comprises two variable length AC drift tube couples, defining a triple gap configuration, wherein a length of at least one variable length AC drift tube couple is adjusted between the first configuration and the second configuration.

* * * * *